United States Patent [19]
Nakamura

[11] Patent Number: 5,797,090
[45] Date of Patent: Aug. 18, 1998

[54] RADIO RECEIVING APPARATUS HAVING CURRENT CONSUMPTION REDUCING FUNCTION

[75] Inventor: Taisuke Nakamura, Tokyo, Japan

[73] Assignee: NEC Corporation, Tokyo, Japan

[21] Appl. No.: 757,941

[22] Filed: Nov. 27, 1996

[30] Foreign Application Priority Data

Dec. 7, 1995 [JP] Japan ................................ 7-318840

[51] Int. Cl.[6] ................................................ H04B 1/16
[52] U.S. Cl. ...................... 455/234.1; 455/338; 455/343
[58] Field of Search ........................ 455/217, 232.1, 455/234.1, 234.2, 241.1, 246.1, 247.1, 250.1, 251.1, 254, 343, 38.3, 574, 338

[56] References Cited

U.S. PATENT DOCUMENTS

| | | | |
|---|---|---|---|
| 4,553,105 | 11/1985 | Saski | 455/250.1 |
| 4,823,398 | 4/1989 | Hashimoto | 455/343 |
| 5,230,096 | 7/1993 | Davies et al. | 455/217 |
| 5,390,357 | 2/1995 | Nobusawa et al. | 455/343 |
| 5,513,386 | 4/1996 | Ogino et al. | 455/234.1 |

FOREIGN PATENT DOCUMENTS

| | | | |
|---|---|---|---|
| 60-4334 | 1/1985 | Japan | 455/234.1 |
| 62-281529 | 12/1987 | Japan | |
| 4-354210 | 12/1992 | Japan | 455/258.1 |

*Primary Examiner*—Nguyen Vo
*Attorney, Agent, or Firm*—Sughrue, Mion, Zinn, Macpeak & Seas, PLLC

[57] ABSTRACT

A radio receiving apparatus includes a high-frequency amplifier, an intermediate-frequency amplifier, a reception electric field strength detector, and a control section. The high-frequency amplifier is connected to a signal line of a reception system for a radio signal and can be disconnected from the signal line. The intermediate-frequency amplifier is connected to the signal line on an output side of the first circuit element and can be disconnected from the signal line. The reception electric field strength detector detects the reception electric field level of a radio signal. The control section performs control to disconnect at least one of the first and second circuit elements from the signal line and also performs control to stop supplying power to the disconnected circuit element in accordance with the electric field level detected by the reception electric field strength detector.

10 Claims, 1 Drawing Sheet

5,797,090

1

RADIO RECEIVING APPARATUS HAVING CURRENT CONSUMPTION REDUCING FUNCTION

BACKGROUND OF THE INVENTION

The present invention relates to a radio receiving apparatus having a function of reducing the current consumption.

Many radio receiving apparatuses, and especially mobile radio telephones, use batteries with limited current-carrying capacities as power supplies. For this reason, the current consumption is preferably reduced as much as possible.

A conventional mobile radio telephone is disclosed in Japanese Patent Laid-Open No. 62-281529. This telephone is designed to detect a reception electric field strength (level) from a reception signal. In accordance with the detection result, the DC currents supplied to the high-frequency amplification circuit and the local oscillation circuit are limited to the extent to which the nonlinear distortion characteristics of the receiving section can be allowed.

In the above conventional mobile radio telephone, although the current consumption is reduced, this reduction is performed only within the range in which the nonlinear distortion characteristics can be allowed. A reduction in current consumption is limited by the degree of the spurious radiation due to the intermodulation.

SUMMARY OF THE INVENTION

It is an object of the present invention to provide a radio receiving apparatus designed to further reduce the current consumption.

In order to achieve the above object, according to the present invention, there is provided a radio receiving apparatus comprising a first circuit element which is connected to a signal line of a reception system for a radio signal and can be disconnected from the signal line, a second circuit element which is connected to the signal line on an output side of the first circuit element and can be disconnected from the signal line, electric field level detection means for detecting a reception electric field level of a radio signal, and control means for performing control to disconnect at least one of the first and second circuit elements from the signal line and also performing control to stop supplying power to the disconnected circuit element in accordance with the electric field level detected by the electric field level detection means.

DESCRIPTION OF THE PREFERRED EMBODIMENT

Figure 1:
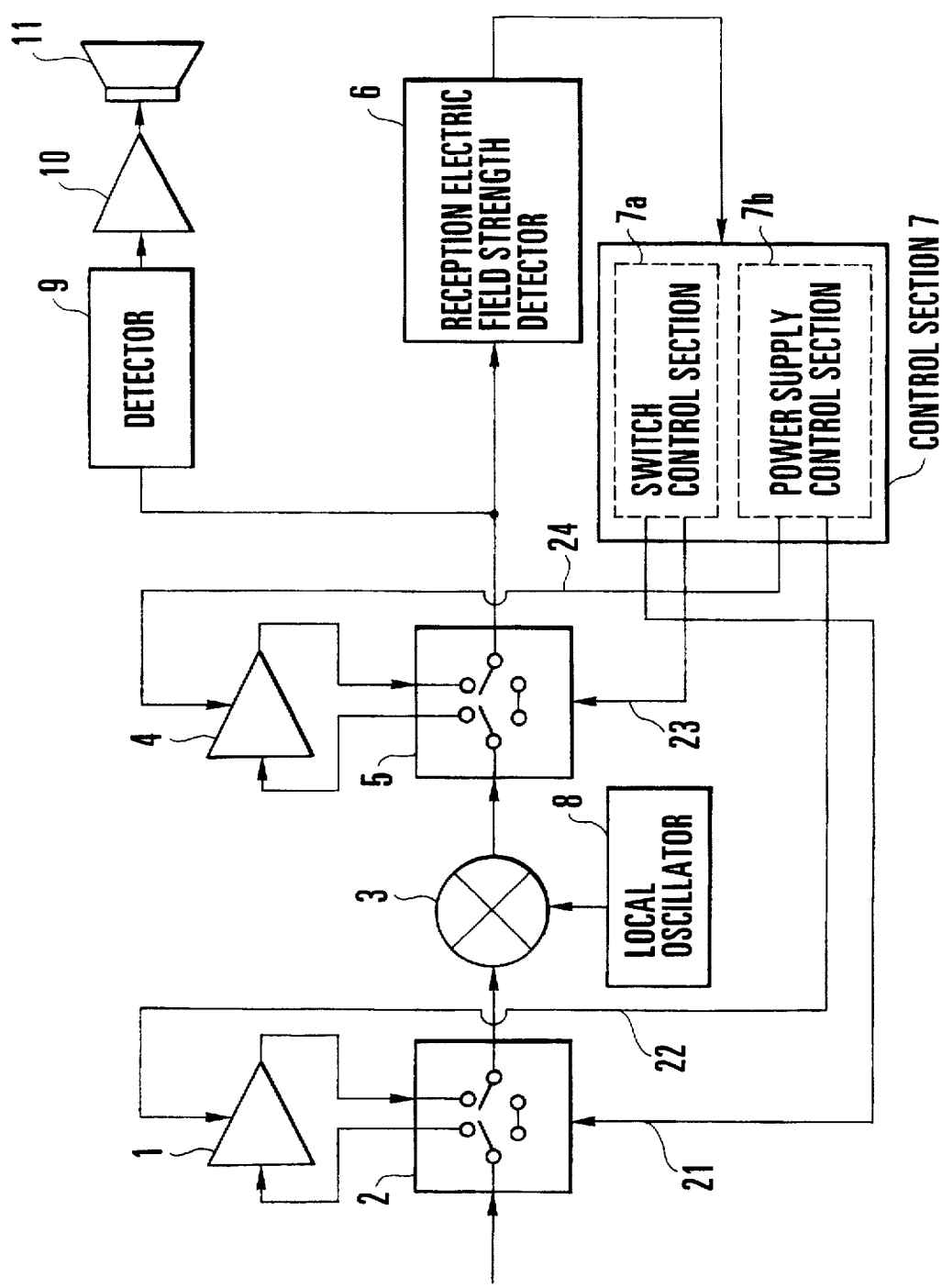
FIG. 1 is a block diagram showing a radio receiving apparatus.

The present invention will be described in detail below with reference to the accompanying drawing.

FIG. 1 shows a radio receiving apparatus according to an embodiment of the present invention. Referring to FIG. 1, the radio receiving apparatus includes a high-frequency amplifier 1 for amplifying a reception signal, a first switch 2 for performing a switching operation to disconnect or not to disconnect the high-frequency amplifier 1 from the reception system, a mixer 3 for mixing a high-frequency signal output from said first switch 2 with a local frequency signal to convert the reception signal into a signal in an intermediate-frequency band, an intermediate-frequency

2 amplifier 4 for amplifying the intermediate-frequency signal output from the mixer 3, a second switch 5 for performing a switching operation to disconnect or not to disconnect the intermediate-frequency amplifier 4 from the reception system, a reception electric field strength detector 6 for receiving the intermediate-frequency signal output from the second switch 5 and detecting the electric field strength (level) of the reception signal, a control section 7 for controlling the high-frequency amplifier 1, the intermediate-frequency amplifier 4, and the first and second switches 2 and 5, a local oscillator 8 for oscillating a local frequency signal and outputting it to the mixer 3, a detector 9 for detecting the intermediate-frequency signal output from the second switch 5 and amplifying the signal wave, a low-frequency amplifier 10 for amplifying the signal wave output from the detector 9, and a loudspeaker (receiver) 11 for outputting the signal wave, output from the low-frequency amplifier 10, as speech.

The first and second switches 2 and 5 normally connect the amplifiers 1 and 4 in series with a signal line. When the amplifiers 1 and 4 are disconnected, the input and output terminals of each switch are short-circuited to allow a signal to pass therethrough. The high-frequency amplifier 1 and the intermediate-frequency amplifier 4 receive power from a battery (not shown). The control section 7 includes a switch control section 7a for controlling the switching operations of the first and second switches 2 and 5 on the basis of the reception electric field strength detected by the reception electric field strength detector 6, and a power supply control section 7b for separately controlling the power ON/OFF operations of the high-frequency amplifier 1 and the intermediate-frequency amplifier 4.

The operation of the above radio receiving apparatus will be described next. The first and second switches 2 and 5 are normally switched to the amplifiers 1 and 4 sides, respectively. In this state, a high-frequency reception signal passes through the first switch 2 and is amplified by the high-frequency amplifier 1. The amplified output from the high-frequency amplifier 1 is input to the mixer 3 and mixed with the output from the local oscillator 8 so as to be converted into an intermediate-frequency signal. The intermediate-frequency output from the mixer 3 passes through the second switch 5 and is amplified by the intermediate-frequency amplifier 4. The amplified output from the intermediate-frequency amplifier 4 is detected by the detector 9, and the signal wave is output. The detected output from the local oscillator 8 is amplified by the low-frequency amplifier 10 and converted into a speech signal, which is output from the loudspeaker 11.

At this time, the output from the intermediate-frequency amplifier 4 is input to the reception electric field strength detector 6. The reception electric field strength detector 6 detects the electric field strength of the reception signal in accordance with the output from the intermediate-frequency amplifier 4, and outputs the detection result to the control section 7.

In general, as is known, when the reception signal is sufficiently large, even if the gain of at least one of the intermediate-frequency amplifier and the high-frequency amplifier is set to zero, a necessary S/N can be maintained.

When the electric strength of the reception signal reaches a first predetermined value, the control section 7 controls the first switch 2 by using a first switching control signal 21 to disconnect the high-frequency amplifier 1 from the reception system, and also controls the intermediate-frequency amplifier 4 by using a first power supply control signal 22 to stop supplying power. In this case, the first predetermined value indicates the electric field strength at which a necessary S/N can be maintained even if the gain of the intermediate-frequency amplifier 4 becomes zero in the reception system.

When the electric field strength exceeds the first predetermined value and reaches a second predetermined value, the control section 7 controls the second switch 5 by using a second switching control signal 23 to disconnect the intermediate-frequency amplifier 4 from the reception system, and also controls the high-frequency amplifier 1 by using a second power supply control signal 24 to stop supplying power. In this case, the second predetermined value indicated the electric field strength at which a necessary S/N can be maintained even if the gain of the high-frequency amplifier 1 becomes zero as well as the gain of the intermediate-frequency amplifier 4.

In the above embodiment, the intermediate-frequency amplifier and the high-frequency amplifier are used as amplifiers which are to be disconnected from the circuit of the reception system and for which the supply of power is to be stopped. However, the types of amplifiers and the like to be disconnected and the disconnecting order are not limited. If, for example, the current consumption amounts of a plurality of amplifiers are different from each other, the amplifiers to be disconnected from the reception system may be sequentially selected one by one in accordance with the reception electric field strength. In addition, a combination of at least two amplifiers may be disconnected from the reception system in accordance with a combination pattern based on the result of comparison between a plurality of reference electric field levels and a reception electric field level.

In addition, the control section 7 stops supplying power by controlling the amplifiers 1 and 4. If, however, an amplifier having no power control function is used, a power switch may be arranged in a power supply path, and the ON/OFF operation of the power switch may be controlled by the control section 7. The above description is associated with the radio receiving apparatus. However, the present invention may be applied to a radio transmitting/receiving apparatus, and power control may be performed on circuit elements other than the amplifiers as long as a receiving operation can be performed.

In addition, the above description is associated with the radio receiving apparatus using a battery with a limited current-carrying capacity as a power supply. However, the present invention may be applied to a radio receiving apparatus using a power supply whose current-carrying capacity is not limited. In this case, an energy saving operation can be performed.

As has been described above, when the reception electric field strength is sufficiently high, circuits including the high-frequency amplifier and the intermediate-frequency amplifier are selectively disconnected from the reception system in accordance with the strength. In addition, by stopping the power supply to the disconnected circuits, the current consumption of the receiving apparatus can be further reduced.

What is claimed is:

1. A radio receiving apparatus comprising:

a first amplifier which is connected in series to a signal line of a reception system for a radio signal and can be disconnected from the signal line; a second amplifier which is connected in series to the signal line on an output side of said first amplifier and can be disconnected from the signal line;

electric field level detection means which is connected to the signal line for detecting a reception electric field level of a radio signal; and control means for ceasing to supply power to and disconnecter from the signal line said first and second amplifiers in accordance with the electric field level detected by said electric field level detection means.

2. An apparatus according to claim 1, wherein said first amplifier is a high-frequency amplifier for amplifying a reception signal, and said second amplifier is an intermediate-frequency amplifier for amplifying an intermediate-frequency signal obtained by converting the output from said high-frequency amplifier.

3. A radio receiving apparatus as recited in claim 2, wherein said control mean s ceases to supply power to and disconnects from said signal line said high-frequency amplifier when the detected electric field level exceeds a first predetermined value, and wherein said control means ceases to supply power to and disconnects from said signal line said intermediate-frequency amplifier when the detected electric field level exceeds a second predetermined value which is greater than said first predetermined value.

4. A radio receiving apparatus as recited in claim 3, wherein said first predetermined value indicates an electric field strength at which a necessary signal-to-noise ratio (S/N) can be maintained even where a gain of said high-frequency amplifier becomes zero, and wherein said second predetermined value indicates an electric field strength at which a necessary signal-to-noise ratio (S/N) can be maintained even where a gain of the high-frequency amplifier and said intermediate-frequency amplifier becomes zero.

5. An apparatus according to claim 1, further comprising:

first switch means for disconnecting said first amplifier from the signal line; and second switch means for disconnecting said second amplifier from the signal line, and wherein said control means performs switching control of said first and second switch means in accordance with the detection result obtained by said electric field level detection means.

6. An apparatus according to claim 4, wherein said first and second switch means normally connect said first and second amplifiers in series with the signal line, and disconnect input and output terminals of said first and second amplifiers from the signal line to short-circuit signal lines corresponding to the disconnected portions in a disconnected state.

7. An apparatus according to claim 5, wherein said control means comprises:

switch control means for controlling said first and second switch means to disconnect said first and second amplifiers from the signal line in accordance with a combination pattern based on the electric field level detected by said electric field level detection means; and power control means for controlling a power supply system for said first and second amplifiers to stop supplying power to said amplifiers disconnected from the signal line.

8. An apparatus according to claim 1, wherein said electric field level detection means compares a plurality of reference electric field levels with a reception electric field level, and said control means determines a amplifier to be disconnected from the signal line in accordance with the comparison result from said electric field level detection means, and sets the reception electric field to an electric field level at which a necessary S/N is maintained.

9. A radio receiving apparatus comprising:

a high-frequency amplifier connected in series with a signal line to amplify a reception signal through a radio channel;

a local oscillator for oscillating a local frequency signal;

a mixer for mixing the output from said high-frequency amplifier with the local frequency signal from said local oscillator to output an intermediate-frequency signal;

an intermediate-frequency amplifier connected in series with the signal line to amplify the intermediate-frequency signal from said mixer;

a first switch for disconnecting said high-frequency amplifier from the signal line;

a second switch for disconnecting said intermediate-frequency amplifier from the signal line;

an electric field strength detector for detecting a reception electric field level of a reception signal; and a control section for controlling said first and second switches to disconnect said high-frequency amplifier and said intermediate-frequency amplifier from the signal line and to stop supplying power to said disconnected amplifiers in accordance with a combination pattern based on the electric field level detected by said electric field strength detector.

10. An apparatus according to claim 9, further comprising a detector for detecting the intermediate-frequency signal output from said second switch and extracting a signal wave;

a low-frequency amplifier for amplifying the output from said detector; and a speech converter for converting the output from said low-frequency amplifier into a speech signal and outputting the signal.

* * * * *